United States Patent
Schell et al.

(10) Patent No.: US 9,052,597 B2
(45) Date of Patent: Jun. 9, 2015

(54) METHODS AND FABRICATION TOOLS FOR FABRICATING OPTICAL DEVICES

(71) Applicants: HUMBOLDT-UNIVERSITÄT zu BERLIN, Berlin (DE); KARLSRUHER INSTITUT FÜR TECHNOLOGIE, Karlsruhe (DE)

(72) Inventors: Andreas Schell, Berlin (DE); Joachim Fischer, Kappelrodeck (DE); Johannes Kaschke, Karlsruhe (DE); Oliver Benson, Berlin (DE); Martin Wegener, Karlsruhe (DE)

(73) Assignees: HUMBOLDT-UNIVERSITÄT ZU BERLIN, Berlin (DE); KARLSRUHER INSTITUTE FÜR TECHNOLOGIE, Karlsruhe (DE)

(*) Notice: Subject to any disclaimer, the term of this patent is extended or adjusted under 35 U.S.C. 154(b) by 75 days.

(21) Appl. No.: 13/856,621

(22) Filed: Apr. 4, 2013

(65) Prior Publication Data
US 2014/0302442 A1 Oct. 9, 2014

(51) Int. Cl.
*G03F 7/20* (2006.01)
*G03F 7/00* (2006.01)
*G02B 6/138* (2006.01)

(52) U.S. Cl.
CPC ............... *G03F 7/20* (2013.01); *G03F 7/0005* (2013.01); *G02B 6/138* (2013.01)

(58) Field of Classification Search
CPC .................................. G03F 7/0005; G03F 7/20
USPC ......................................................... 430/321
See application file for complete search history.

(56) References Cited

U.S. PATENT DOCUMENTS

| 2004/0047561 A1 | 3/2004 | Tuda |
| 2005/0208431 A1* | 9/2005 | Devoe et al. .................. 430/321 |
| 2008/0044127 A1 | 2/2008 | Leising et al. |

FOREIGN PATENT DOCUMENTS

| JP | 2003-315608 | 11/2003 |
| JP | 2008-249913 | 10/2008 |

OTHER PUBLICATIONS

European Search Report dated Aug. 7, 2014 issued in connection with European Application No. 14162345.4.
(Continued)

*Primary Examiner* — John A McPherson
(74) *Attorney, Agent, or Firm* — Foley & Lardner LLP (57) ABSTRACT

An embodiment of the present invention relates to a method of fabricating an optical device, the method comprising the steps of:
  depositing a photoresist layer on a carrier, said photoresist layer containing at least one optical component,
  determining the position of the at least one optical component inside the photoresist layer before exposing the photoresist layer to a first radiation, said first radiation being capable of transforming the photoresist layer from an unmodified state to a modified state,
  elaborating a device pattern based on the position of the at least one optical component, and
  fabricating the elaborated device pattern by locally exposing the photoresist layer to the first radiation and locally transforming the photoresist layer from the unmodified state to the modified state.

17 Claims, 8 Drawing Sheets

(56) References Cited

OTHER PUBLICATIONS

Jeremy L. O'Brien et al., "Photonic quantum technologies", Nature Photonics, vol. 3, Dec. 2009, pp. 687-695.
Oliver Benson, "Assembly of hybrid photonic architectures from nanophotonic constituents" Nature, vol. 480, Dec. 8, 2011, pp. 193-199.
Antonio Bandolato et al., "Deterministic Coupling of Single Quantum Dots to Single Nanocavity Modes", Science 308 (2005) pp. 1158-1161.
Kanna Aoki et al., "Coupling of quantum-dot light emission with a three-dimensional photonic-crystal nanocavity", Nature Photonics, vol. 2, Nov. 2008, pp. 688-692.
S. Kawata et al., "Finer features for functional microdevices", Nature, vol. 412, Aug. 16, 2001, pp. 697-698.
Markus Deubel et al., "Direct laser writing of three-dimensional photonic-crystal templates for telecommunications", Nature Materials, vol. 3, Jul. 2004, pp. 444-447.
Zhao-Pei Liu et al., "Direct laser writing of whispering gallery microcavities by two-photon polymerization", Applied Physics Letters, 97, (2010), 21105-1-21105-3.
Tobias Grossmann et al., "Direct laser writing for active and passive high-Q polymer microdisks on silicon", Optics Express, vol. 19, No. 12, Jun. 6, 2011, pp, 11451-11456.
Chee-Wei Lee et al., "Perpendicular coupling to in-plane photonics using arc waveguides fabricated via two-photon polymerization". Applied Physics Letters, 100, (2012) pp. 171102-1-171102-3.
Hong-Bo Sun et al., "Two-photon photopolymerization and diagnosis of three-dimensional microstructures containing fluorescent dyes", Applied Physics Letters, 79, (2001) pp. 1411-1413.
Jiafang Li et al., "Fabrication of three-dimensional woodpile photonic crystals in a PbSe quantum dot composite material", Optics Express, vol. 14, No. 22, Oct. 30, 2006, pp. 10740-10745.
Shobha Shukla et al., "Subwavelength Direct Laser Patterning of Conductive Gold Nanostructures by Simultaneous Photopolymerization and Photoreduction", $^{ACS}$NANO, vol. 5, No. 3, 2011, pp. 1947-1957.

\* cited by examiner

Fig. 14 ated device pattern by locally exposing the photoresist layer to the first radiation and locally transforming the photoresist layer from the unmodified state to the modified state.

METHODS AND FABRICATION TOOLS FOR FABRICATING OPTICAL DEVICES

The invention relates to methods and fabrication tools for fabricating optical devices, in particular devices which comprise single photon emitters.

BACKGROUND OF THE INVENTION

On-chip photonic circuits working at the single-quantum level play an important role for future quantum information processing [1]. Several approaches to assemble such quantum photonic devices from different fundamental photonic entities have been pursued [2]. For example, by using self-assembled quantum dots in semiconductor membranes, one can exploit the full power of semiconductor nanofabrication technology, and sophisticated structures have been demonstrated [1], even with on-demand coupling architectures [3]. However, this approach is limited to two-dimensional structures, except for few results obtained by extremely challenging manual membrane-stacking [4].

Another easy and low-cost way of fabricating photonic structures is optical lithography via direct laser writing (DLW) [5, 6] where a tightly focussed femtosecond laser beam is used to expose a photoresist. The use of multi-photon absorption enables a sequential 3D exposure by scanning the sample or the focus of the laser. For common negative-tone photoresists, unexposed parts are removed during a development step and the 3D polymer structures remain. DLW is well known for the fabrication of photonic crystals [6] or other photonic elements like resonators [7, 8] and waveguides [9]. In order to functionalise the structures with optically active material, fluorescent dyes [10], quantum dots [11] and metal nanoparticles [12] have been incorporated. However, until today there has been no 3D structure operating at the fundamental quantum level with single photons from single emitters being collected and routed. Moreover, no combinations of multiple optical elements (different resonators, couplers, waveguides) have been demonstrated. The reason is the lack of photostable quantum emitters which are compatible with the DLW process while still preserving the possibility for high-quality DLW fabrication.

OBJECTIVE OF THE PRESENT INVENTION

An objective of the present invention is to provide reliable methods and tools for fabricating optical devices that are difficult to handle, for instance small optical components such as single photon emitters.

BRIEF SUMMARY OF THE INVENTION

An embodiment of the present invention relates to a method of fabricating an optical device, the method comprising the steps of:
 depositing a photoresist layer on a carrier, said photoresist layer containing at least one optical component,
 determining the position of the at least one optical component inside the photoresist layer before exposing the photoresist layer to a first radiation, said first radiation being capable of transforming the photoresist layer from an unmodified state to a modified state,
 elaborating a device pattern based on the position of the at least one optical component, and
 fabricating the elaborated device pattern by locally exposing the photoresist layer to the first radiation and locally transforming the photoresist layer from the unmodified state to the modified state.

An advantage of this embodiment of the invention is that there is no need to apply any measures to guarantee a predefined location of the optical component on the carrier before the photoresist is deposited. The position of the optical component is not relevant and may vary in a wide range because the location of the optical component may be determined and evaluated after the photoresist is deposited.

Furthermore, the step of locally exposing the photoresist layer to radiation (herein referred to as first radiation that transforms the photoresist layer from an unmodified state to a modified state) can be carried out using the same optical system that is used to locate the optical component on the carrier. Therefore, misalignment errors can be avoided or at least significantly minimized.

The at least one optical component may be a single photon emitter.

The step of determining the position of the at least one optical component inside the photoresist layer preferably includes:
 generating a second radiation that is incapable of transforming the photoresist layer from the unmodified state to the modified state, and
 observing the response of the at least one optical component to the second radiation.

The at least one optical component may be adapted to generate a third radiation in response to being exposed to the second radiation. Said step of observing the response of the at least one optical component may include detecting and/or evaluating the third radiation. The photoresist is preferably unresponsive to the third radiation.

According to a further preferred embodiment of the present invention the method further comprises the step of locally polymerizing the photoresist layer by locally exposing the photoresist layer to the first radiation, the polymerized photoresist being transparent for radiation that is generated by the optical component and/or transparent to radiation that excites the optical component to generate radiation.

The device pattern may be fabricated by selectively exposing those sections of the photoresist layer that correspond to sections of the elaborated device pattern.

The photoresist layer may contain at least two optical components. The position of the first optical component and the position of the second optical component are preferably determined inside the photoresist layer before exposing the photoresist layer to the first radiation. Then, a connection pattern may be elaborated that provides a future physical connection between the first optical component and the second optical component. The connection pattern may be fabricated by selectively exposing those sections of the photoresist layer that correspond to sections of the elaborated connection pattern.

The physical connection is preferably an optical connection for transmitting optical radiation between the first and second optical components.

Alternatively, the photoresist layer may contain a plurality of optical components. In this case, a connection pattern may be elaborated that provides a future physical connection between at least a group of optical elements out of said plurality of optical components. The connection pattern may be fabricated by selectively exposing those sections of the photoresist layer that correspond to sections of the elaborated connection pattern, and by developing the photoresist layer.

The step of determining the position of the at least one optical component and said step of fabricating the device pattern may be carried out using the same optical system. For instance, the same microscope may be used for determining the position of the at least one optical component and for applying the first radiation to the photoresist layer. Using the same optical system helps to avoid misalignment errors and increases the success rate or gain of the fabrication process.

According to a preferred embodiment, the same confocal microscope is used for the following steps:
generating the second radiation,
observing the response of the at least one optical component to the second radiation,
detecting and/or evaluating a third radiation generated by the at least one optical component in response to being exposed to the second radiation, and
locally exposing the photoresist layer to the first radiation and locally transforming the photoresist layer from the unmodified state to the modified state.

The photoresist may be polymerized in response to exposure to the first radiation. The polymerized photoresist may be transparent for radiation that is generated by the optical device. For instance, the polymerized photoresist is preferably also transparent for a second radiation and a third radiation wherein the second radiation is capable of exciting the optical device to generate a third radiation, and wherein the third radiation is generated by the optical device while being excited by the second radiation.

After determining the position of the at least one optical component inside the photoresist layer and before exposing the photoresist layer to said first radiation, the position of the at least one optical component may be changed by applying a fourth radiation.

A further embodiment of the present invention relates to a method comprising the steps of:
depositing a photoresist layer on a carrier, said photoresist layer comprising at least one optical component, determining the position of the at least one optical component inside the photoresist layer before exposing the photoresist layer to radiation having a wavelength and/or pulse pattern that is capable of transforming the photoresist layer from an unmodified state to a modified state,
elaborating a device pattern based on the position of the at least one optical component, and
fabricating the elaborated device pattern by locally exposing the photoresist layer to the radiation and locally transforming the photoresist layer from the unmodified state to the modified state.

Said step of determining the position of the at least one optical component inside the photoresist layer preferably includes:
generating a radiation having a second wavelength and/or pulse pattern that is incapable of transforming the photoresist layer from the unmodified state to the modified state, and
observing the response of the at least one optical component to the radiation of the second wavelength and/or pulse pattern.

Said at least one optical component may be adapted to generate a radiation of a third wavelength in response to being exposed to the radiation of the second wavelength and/or pulse pattern, said emitted radiation of the third wavelength being incapable of transforming the photoresist layer from the unmodified state to the modified state.

Said step of observing the response of the at least one optical component preferably includes detecting and/or evaluating the radiation of the third wavelength.

A further embodiment of the present invention relates to a method comprising the steps of:
depositing a photoresist layer on a carrier, said photoresist layer comprising at least one optical single photon emitter,
determining the position of the at least one optical single photon emitter inside the photoresist layer before locally exposing the photoresist layer to radiation that is capable of polymerizing the photoresist layer,
elaborating a device pattern depending on the position of the at least one optical single photon emitter, and
fabricating the elaborated device pattern by locally polymerizing the photoresist layer by locally exposing the photoresist layer to said radiation, and developing the photoresist layer.

A further embodiment of the present invention relates to a fabrication tool comprising:
a first emitter unit capable of generating a first radiation capable of transforming a photoresist layer from an unmodified state to a modified state,
a second emitter unit capable of generating a second radiation capable of exciting optical components inside the photoresist layer to generate a third radiation,
a detector capable of detecting the third radiation,
an optical system adapted to direct radiation generated by the first emitter unit and/or the second emitter unit onto the photoresist layer, and
a processor unit for controlling the optical system, the first emitter unit, and the second emitter unit,
wherein the processor unit is configured to determine the positions of the optical components inside the photoresist layer, to elaborate a device pattern based on the positions of the optical components, and to fabricate the elaborated device pattern by locally exposing the photoresist layer to the first radiation.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended figures. Understanding that these figures depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings, wherein identical or comparable parts are designated by the same reference signs throughout. It will be readily understood that the present invention, as generally described herein, could vary in a wide range. Thus, the following more detailed description of the exemplary embodiments of the present invention, is not intended to limit the scope of the invention, as claimed, but is merely representative of presently preferred embodiments of the invention.

An exemplary embodiment of a method for fabricating an optical device 300 (see FIG. 9) will be explained hereinafter with reference to FIGS. 1-9.

Figure 1:
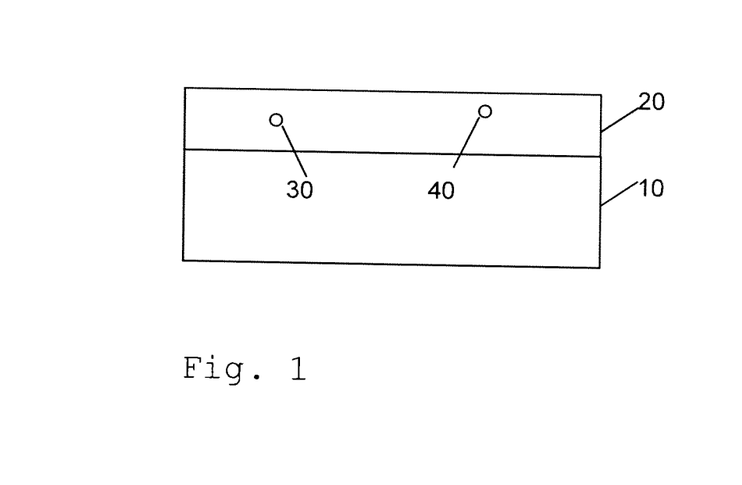
FIGS. 1-9 show—in exemplary fashion—fabrication steps for fabricating an optical device, and an exemplary embodiment of a fabrication tool for carrying out the steps shown in FIGS. 1-9, FIGS. 10-11 show modified fabrication steps for fabricating a 3D-photoresist pattern.

FIG. 1 shows a carrier 10 (e. g. a silicon carrier) after depositing a photoresist layer 20 thereon. The photoresist layer 20 contains a plurality of optical components, for instance at least two single photon emitters which are marked by reference numerals 30 and 40 in FIG. 1.

The photoresist layer 20 may be based on monomer pentaerythritol tetraacrylate (PETTA) which may contain 350 ppm monomethyl ether hydroquinone as inhibitor. 0.25% wt of photoinitiator 7-diethylamino-3-thenoylcoumarin may be added.

The single photon emitters 30 and 40 may be imbedded in the photoresist by adding 2% wt of an ethanol-based nanodiamond suspension and by stirring the mixture. The nanodiamonds may be of type 1$b$ and may have a median diameter of approximately 25 nm. Such nanodiamonds are available from Microdiamant AG.

Alternative photoresists include any negative-tone photoresist based on free radical polymerization, cationic polymerization, or other polymerization chemistries (e.g., Thiol-Ene reactions). A wide variety of polymerizable substances (monomers, oligomers, pre-polymers) is applicable. Among commercially available photoresists, SU-8 (Microchem Corp.) or photoresists out of the ORMOCER class (Fraunhofer ISC) are potential candidates.

Alternative single photon emitters include various defect centers in nanocrystals from materials like Silicon, Silicon Carbide, Zinc Oxide and quantum dot structures made of semi-conductors like Zinc Selenide and Cadmium Selenide.

The photoresist layer 20 may be dried or thermally treated in order to increase its mechanical stability and prevent the single photon emitters 30 and 40 from drifting inside the photoresist layer 20. However, such an additional treatment is not mandatory.

The single photon emitters 30 and 40 are capable of generating radiation in response to radiation they receive. This will be explained in further detail below.

Figure 2:
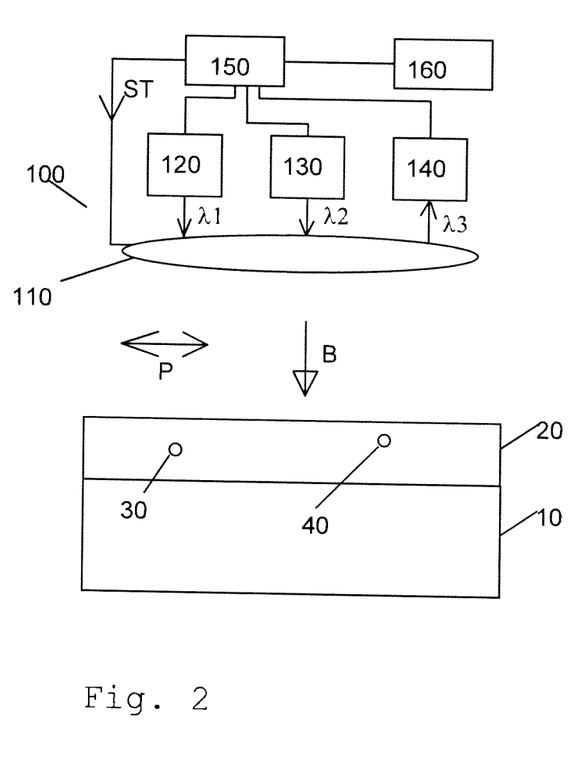
Figure 3:
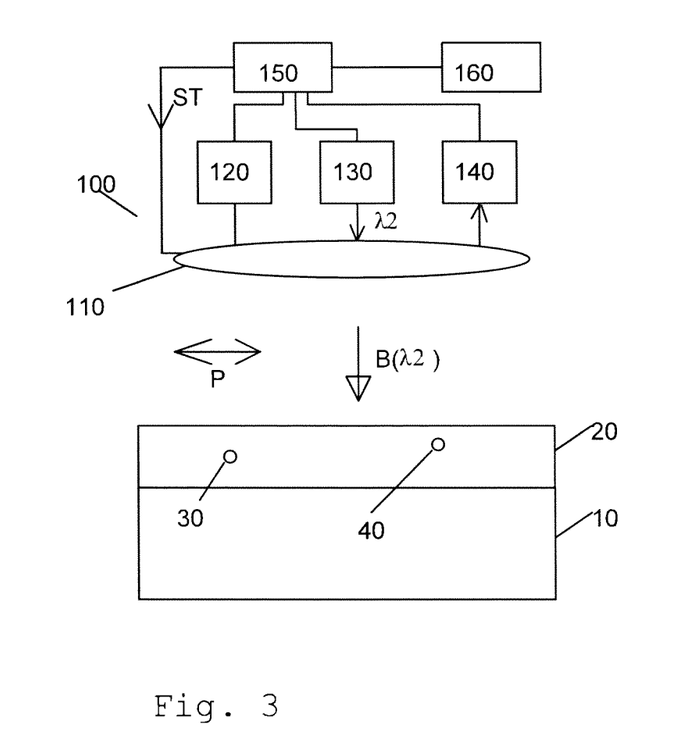
Figure 4:
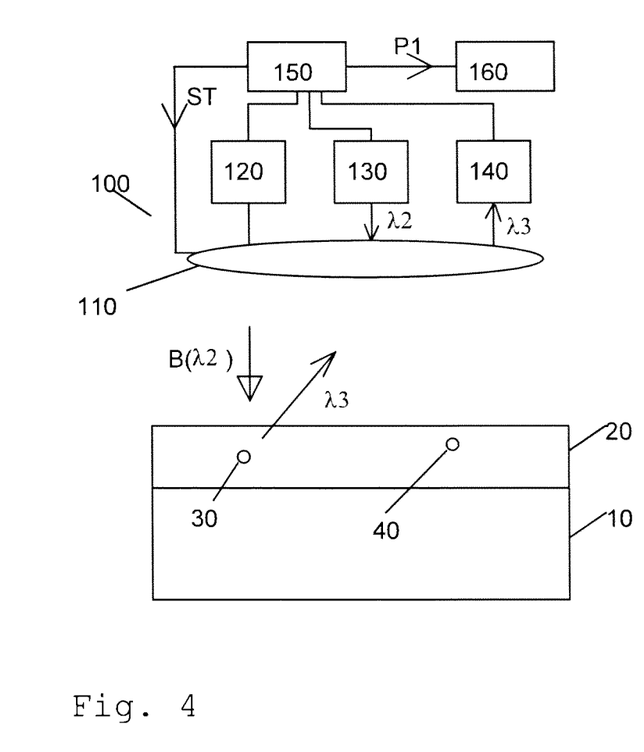

In order to fabricate a photoresist pattern and a device pattern that includes both single photon emitters 30 and 40, a fabrication tool in form of an exposure and detection device 100 as shown in FIG. 2 may be used. The exposure and detection device 100 preferably comprises an optical system 110, a first emitter unit 120, a second emitter unit 130, a detector 140, and a processor unit 150.

The first emitter unit 120 is capable of generating a first radiation $\lambda 1$ having a wavelength or wavelength range that can transform the photoresist layer 20 from an unmodified state to a modified state. Preferably, the first radiation $\lambda 1$ is able to polymerize the photoresist layer 20. In case of a photoresist layer made of monomer pentaerythritol tetraacrylate (PETTA) as described above, the first radiation $\lambda 1$ preferably includes a wavelength of 800 nm and may be pulsed.

The second emitter unit 130 can generate a second radiation $\lambda 2$ having a wavelength or wavelength range that cannot transform the photoresist layer 20 from the unmodified state to the modified state. Instead, the second radiation $\lambda 2$ is capable of exciting the single photon emitters 30 and 40 to generate a third radiation $\lambda 3$.

In case of single photon emitters based on nanodiamonds, and a photoresist layer 20 as decribed above, the second radiation $\lambda 2$ preferably includes a wavelength of 532 nm. If illuminated by such a radiation, nanodiamonds typically generate radiation having a wavelength of 700 nm. This radiation is also incapable of transforming the photoresist layer 20 from the unmodified state to the modified state due to its low power and non-absorbed wavelength.

The detector 140 is capable of detecting the third radiation $\lambda 3$ if and when such radiation is generated by the single photon emitters 30 and/or 40.

The optical system 110 may comprise or consist of a microscope such as a confocal microscope which is adapted to focus radiation generated by the first emitter unit 120 and/or the second emitter unit 130 onto the photoresist layer 20. The resulting focussed radiation beam is marked by reference sign B in FIG. 2.

The relative position of the radiation beam B with respect to the underlying photoresist layer 20 may be varied by the optical system 110 in response to a control signal ST generated by the processor unit 150. The relative two-dimensional movement of the radiation beam B is indicated by arrow P in FIG. 2.

The processor unit 150 is preferably configured (

Before exposing the photoresist layer 20 to the e. g. programmed) to control and enable the following process steps: first radiation $\lambda 1$, the positions of the single photon emitters 30 and 40 inside the photoresist layer 20 are determined. To this end, the processor unit 150 enables the second emitter unit 130 to generate the second radiation $\lambda 2$ in order to excite the single photon emitters 30 and 40 to generate the third radiation $\lambda 3$. Since the position of the single photon emitters 30 and 40 is unknown at this stage, the second radiation $\lambda 2$ or its radiation beam B($\lambda 2$) is scanned over the photoresist layer 20 in order to detect a response of one of the single photon emitters buried and hidden in the photoresist layer 20 (see FIG. 3).

As soon as the second radiation $\lambda 2$ or its radiation beam B($\lambda 2$) hits the single photon emitter 30, the latter generates the third radiation $\lambda 3$ which will be detected by the detector 140. This enables the processor unit 150 to determine and store the position P1 of the single photon emitter 30 in an internal or external memory 160 (see FIG. 4).

Figure 5:
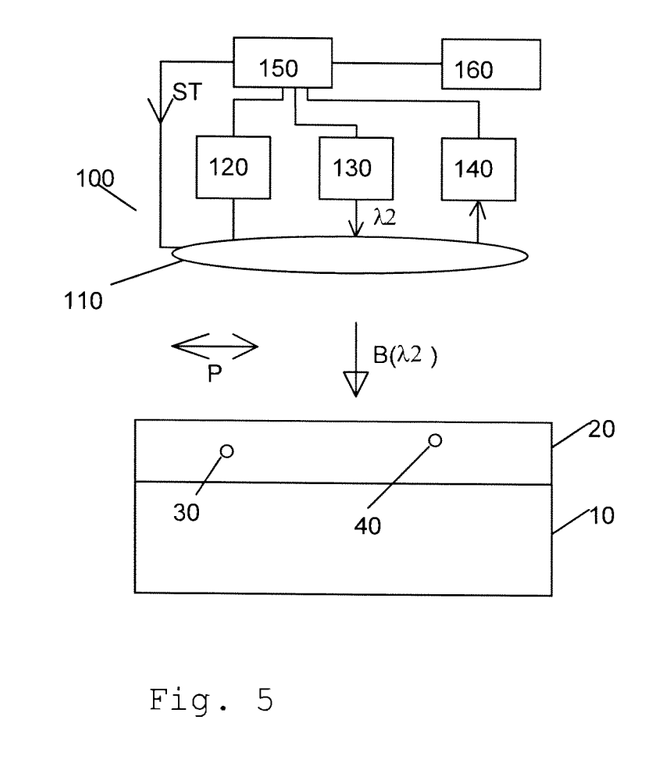
Figure 6:
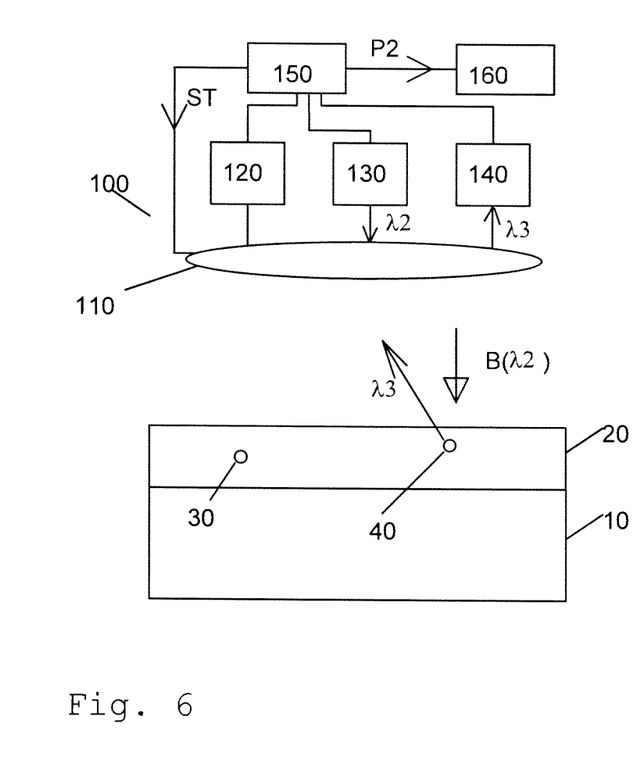

Then, the processor unit 150 continues the search for the other single photon emitter 40 in order to determine its exact position (see FIG. 5). When the single photon emitter 40 is excited by the second radiation $\lambda 2$, it generates the third radiation $\lambda 3$ which in turn is detected by the detector 140 (see FIG. 6). The detector 140 transmits this information to the processor unit 150 which determines and stores the corresponding position P2 of the single photon emitter 40 in the memory 160.

Figure 7:
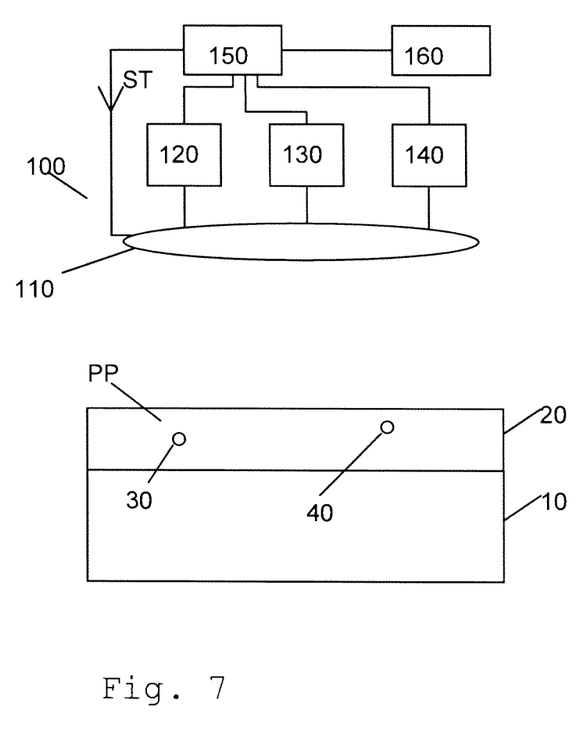

Thereafter, the processor unit 150 elaborates a photoresist pattern PP that will define the device pattern of the later completed optical device. The elaborated photoresist pattern PP is indicated in FIG. 7 by dotted lines.

Figure 8:
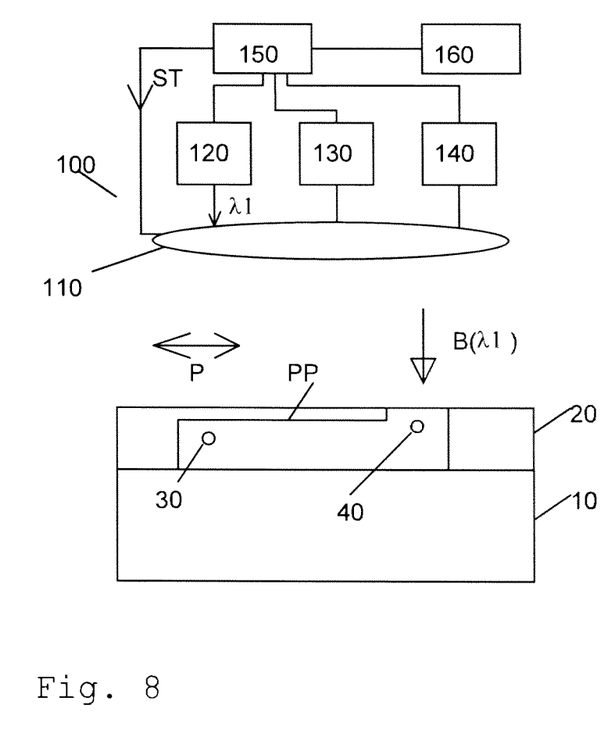
Figure 9:
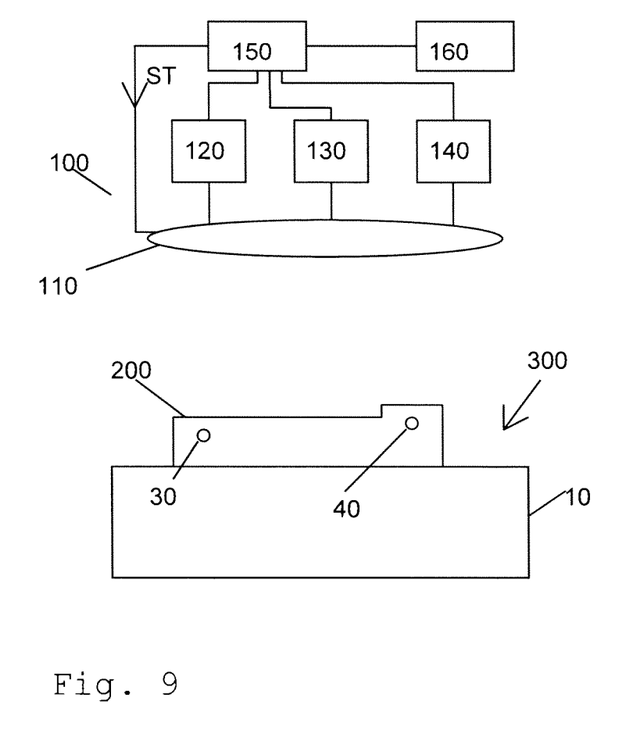

Then, the processor unit 150 initiates and controls the fabrication of the elaborated device pattern PP by locally exposing the photoresist layer 20 to the first radiation $\lambda 1$ and locally transforming the photoresist layer 20 from the unmodified state to the modified state (see FIG. 8). FIG. 9 shows the fabricated optical device 300 after developing the photoresist layer 20, i.e. after locally removing the unexposed regions of the photoresist layer 20.

The transition preferably includes a polymerization of the photoresist layer 20. The polymerized photoresist is preferably transparent, e.g. transparent for the second and/or the third radiation $\lambda 2$ and $\lambda 3$. In the latter case, the polymerized photoresist may serve as a waveguide 200 or waveguide structure, which connects the two single photon emitters 30 and 40 with each other and/or with one or more other optical components. In other words, the polymerized photoresist 200 may also be useful during the future operation of the completed optical device 300.

In summary, the fabrication steps shown in FIGS. 1-9 yield an optical device 300 which comprises two single photon emitters 30 and 40 that are optically connected by the waveguide 200. Through this waveguide 200, radiation may be transmitted from the single photon emitter 30 to the single photon emitter 40 and vice versa.

Figure 10:
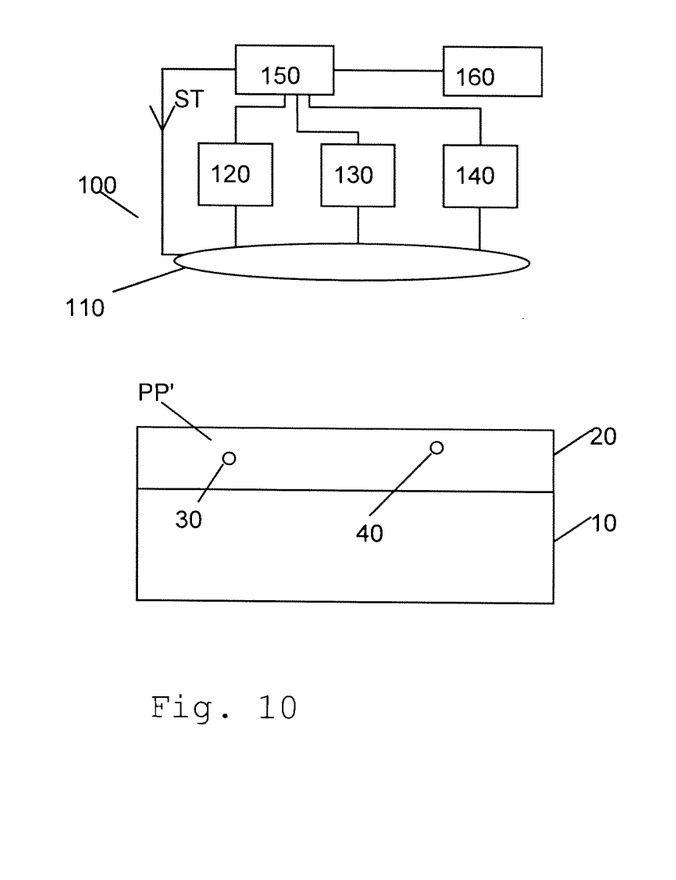
Figure 11:
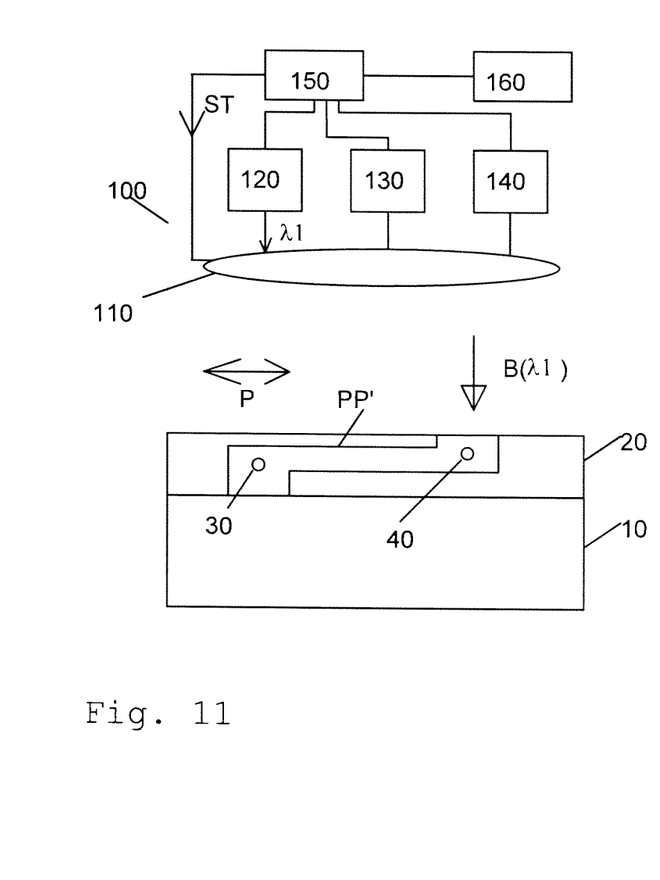

The local exposure of the photoresist layer 20 to the first radiation λ1 may take the thickness of the photoresist layer 20 into account. By focussing the beam B(λ1) onto different planes during the exposure step, three-dimensional waveguides 200' or three-dimensional waveguide structures can be fabricated. This is shown in FIGS. 10 and 11 which visualize the steps of elaborating a 3D-photoresist pattern PP' and therefore a 3D-device pattern, and fabricating the elaborated device pattern PP' by locally exposing the photoresist layer 20 to the first radiation λ1. The unexposed photoresist can then be removed in a developing step.

Furthermore, it is possible to mechanically fix or freeze the location of the single photon emitters after their position has been located. To this end, the first radiation λ1 may be generated to locally polymerize the photoresist layer 20 in the region where the respective single photon emitter has been found before consecutive fabrication steps are initiated.

Figure 12:
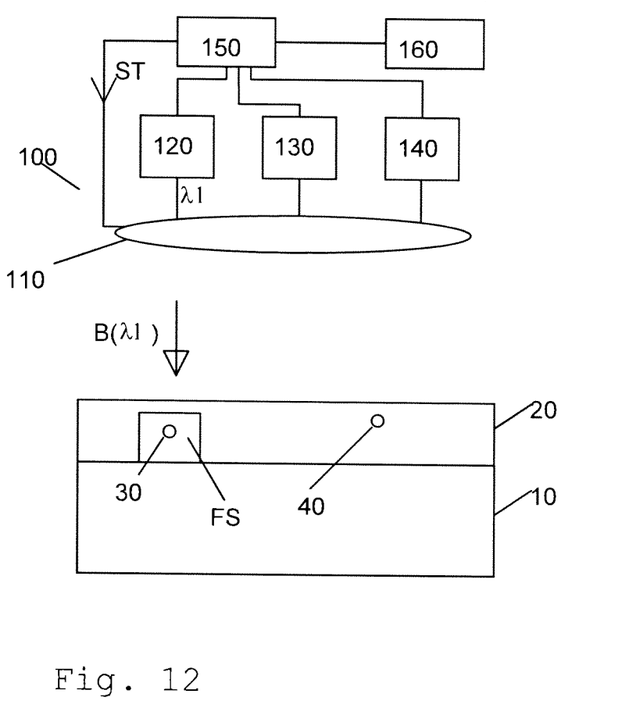
FIGS. 12-13 show additional fabrication steps for freezing the positions of optical components inside a photoresist layer.

An example of the corresponding additional freezing step is shown with reference to the single photon emitter 30 in FIG. 12. This additional freezing step can be carried out after determining the position of the single photon emitter 30 (see FIG. 4) and before searching for the other single photon emitter 40 (see FIG. 5). The polymerized and therefore "frozen" photoresist section is designated by reference sign FS in FIG. 12.

Figure 13:
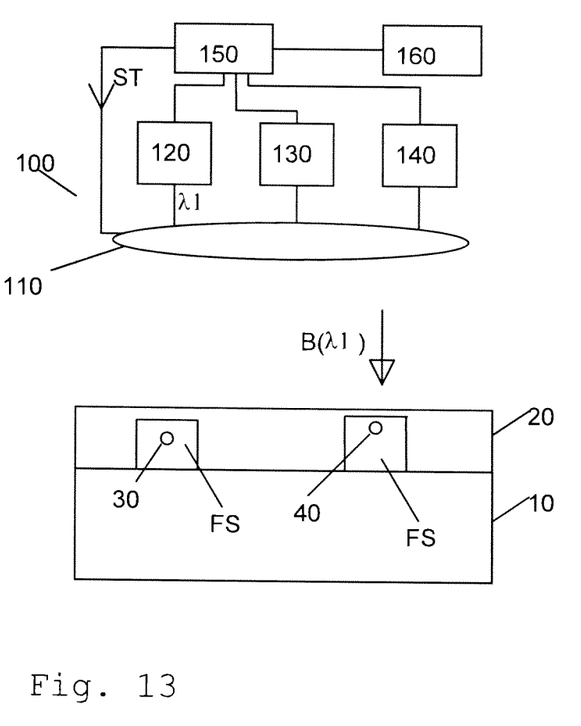

In a similar fashion, the location of the single photon emitter 40 can be fixed or frozen before further steps are carried out. For instance, the first radiation λ1 may be generated to locally polymerize the photoresist layer 20 in the region where the single photon emitter 40 has been found (see FIG. 13) before the device pattern PP' is elaborated or fabricated (see FIGS. 10 and 11).

Further, it is possible to change the position of the single photon emitters 30 and 40 after their positions have been located. To this end, a fourth radiation λ4 having a wavelength of 1064 nm may be generated to locally move the single photon emitters. In an exemplary fashion, FIG. 14 shows the movement of the single photon emitter 30 after its position has been determined and before fixing or freezing the position (see FIG. 12) and/or before continuing the search for the other single photon emitter 40 (see FIG. 5) and/or before elaborating and fabricating the device pattern PP' (see FIGS. 10 and 11).

Figure 14:
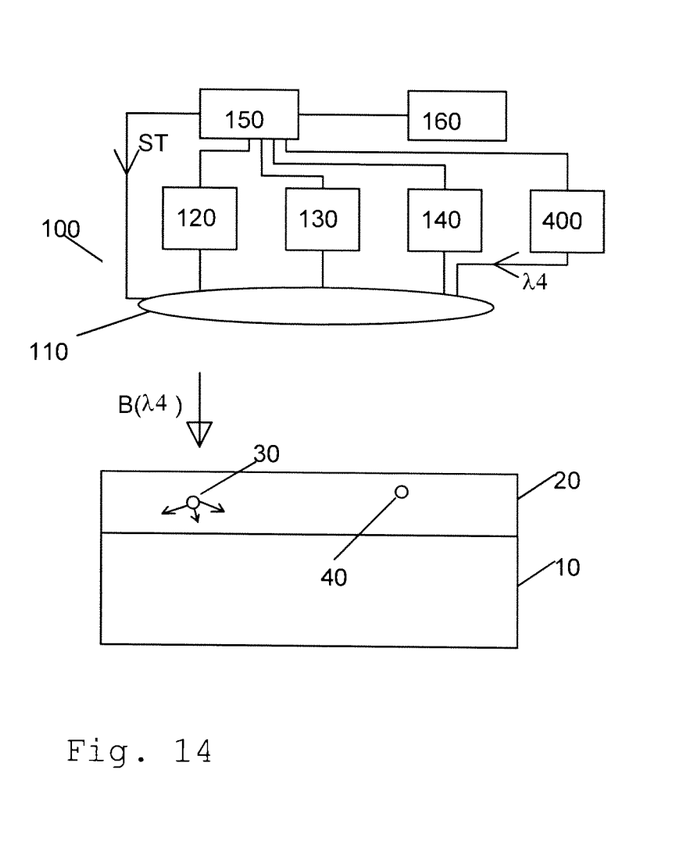
FIG. 14 shows an additional fabrication step for moving optical components inside a photoresist layer before exposure and development of the photoresist layer.

In order to generate the fourth radiation λ4 the exposure and detection device 100 may include a third emitter unit 400 as shown in FIG. 14.

REFERENCE SIGNS 10 carrier
20 photoresist layer
30 single photon emitter
40 single photon emitter
100 exposure and detection device
110 optical system
120 first emitter unit
130 second emitter unit
140 detector
150 processor unit
160 memory
200 waveguide
300 fabricated optical device
400 third emitter unit
λ1 first radiation
λ2 second radiation
λ3 third radiation
λ4 fourth radiation
B beam
B(λ1) beam of first radiation
B(λ2) beam of second radiation
B(λ3) beam of third radiation
B(λ4) beam of fourth radiation
FS polymerized section
B movement
PP photoresist pattern/device pattern
PP' photoresist pattern/device pattern
P1 position of single photon emitter
P2 position of single photon emitter
ST control signal

LITERATURE

[1] O'Brien, J. L., Furusawa, A., and Vuckovic, J. Photonic quantum technologies. Nature Photon. 3, 687{695 (2009).

[2] Benson, O. Assembly of hybrid photonic architectures from nanophotonic constituents, Nature 480, 193{199 (2011).

[3] Badolato, A. et al. Deterministic coupling of single quantum dots to single nanocavity modes. Science 308, 1158{1161 (2005).

[4] Aoki, K. et al. Coupling of quantum-dot light emission with a three-dimensional photoniccrystal nanocavity. Nature Photon. 2, 688{692 (2008).

[5] Kawata, S., Sun, H. B., Tanaka, T., and Takada, K. Finer features for functional microdevices, Nature 412, 697{698 (2001).

[6] Deubel, M. et al. Direct laser writing of three-dimensional photonic-crystal templates for telecommunications, Nature Mater. 3, 444{447 (2004).

[7] Liu, Z. P. et al. Direct laser writing of whispering gallery microcavities by two-photon polymerization, Appl. Phys. Lett. 97, 211105{211105 (2010).

[8] Grossmann, T. et al. Direct laser writing for active and passive high-q polymer microdisks on silicon. Opt. Express 19, 11451{11456 (2011).

[9] Lee, C.-W., Pagliara, S., Keyser, U., and Baumberg, J. J. Perpendicular coupling to in-plane photonics using arc waveguides fabricated via two-photon polymerization. Appl. Phys. Lett. 100, 171102 (2012).

[10] Sun, H., Tanaka, T., Takada, K., and Kawata, S. Two-photon photopolymerization and diagnosis of three-dimensional microstructures containing uorescent dyes. Appl. Phys. Lett. 79, 1411 (2001).

[11] Li, J., Jia, B., Zhou, G., and Gu, M. Fabrication of three-dimensional woodpile photonic crystals in a PbSe quantum dot composite material. Opt. Express 14, 10740{10745 (2006).

[12] Shukla, S. et al. Subwavelength direct laser patterning of conductive gold nanostructures by simultaneous photopolymerization and photoreduction. ACS Nano 5, 1947{1957 (2011).

The invention claimed is:

1. Method of fabricating an optical device, the method comprising the steps of:
    depositing a photoresist layer on a carrier, said photoresist layer containing at least one optical component,
    determining the position of the at least one optical component inside the photoresist layer before exposing the photoresist layer to a first radiation, said first radiation being capable of transforming the photoresist layer from an unmodified state to a modified state,
    elaborating a device pattern based on the position of the at least one optical component, and
    fabricating the elaborated device pattern by locally exposing the photoresist layer to the first radiation and locally transforming the photoresist layer from the unmodified state to the modified state,
    wherein the at least one optical component is a single photon emitter.

2. Method of claim 1 wherein the photoresist is polymerized in response to exposure to the first radiation, the polymerized photoresist being transparent for each of the following radiations:
    a second radiation that is capable of exciting the optical device to generate a third radiation, and
    the third radiation that is generated by the optical device while being excited by the second radiation.

3. Method of fabricating an optical device, the method comprising the steps of:
    depositing a photoresist layer on a carrier, said photoresist layer containing at least one optical component,
    determining the position of the at least one optical component inside the photoresist layer before exposing the photoresist layer to a first radiation, said first radiation being capable of transforming the photoresist layer from an unmodified state to a modified state,
    elaborating a device pattern based on the position of the at least one optical component, and
    fabricating the elaborated device pattern by locally exposing the photoresist layer to the first radiation and locally transforming the photoresist layer from the unmodified state to the modified state,
    wherein said step of determining the position of the at least one optical component inside the photoresist layer includes:
        generating a second radiation that is incapable of transforming the photoresist layer from the unmodified state to the modified state, and
        observing the response of the at least one optical component to the second radiation, and wherein
    said at least one optical component is adapted to generate a third radiation in response to being exposed to the second radiation, and
    said step of observing the response of the at least one optical component includes detecting and/or evaluating the third radiation.

4. Method of claim 3 wherein said photoresist is unresponsive to the third radiation.

5. Method of claim 3 further comprising the step of:
    locally polymerizing the photoresist layer by locally exposing the photoresist layer to the first radiation, the polymerized photoresist being transparent for radiation that is generated by the optical component and/or transparent to radiation that excites the optical component to generate radiation.

6. Method of claim 3
    wherein the photoresist layer contains at least two optical components,
    wherein the position of the first optical component and the position of the second optical component are determined inside the photoresist layer before exposing the photoresist layer to the first radiation,
    wherein a connection pattern is elaborated that provides a future physical connection between the first optical component and the second optical component, and
    wherein the connection pattern is fabricated by selectively exposing those sections of the photoresist layer that correspond to sections of the elaborated connection pattern.

7. Method of claim 6 wherein the physical connection is an optical connection for transmitting optical radiation between the first and second optical components.

8. Method of claim 3
    wherein the photoresist layer contains a plurality of optical components,
    wherein a connection pattern is elaborated that provides a future physical connection between at least a group of optical elements out of said plurality of optical components, and
    wherein the connection pattern is fabricated by selectively exposing those sections of the photoresist layer that correspond to sections of the elaborated connection pattern, and developing the photoresist layer.

9. Method of claim 3 wherein
    said step of determining the position of the at least one optical component and said step of fabricating the device pattern are carried out using a same optical system.

10. Method of claim 9 wherein
    a same microscope is used for determining the position of the at least one optical component and for applying the first radiation to the photoresist layer.

11. Method of claim 3 wherein
    a same confocal microscope is used for the following steps:
        generating the second radiation,
        observing the response of the at least one optical component to the second radiation,
        detecting and/or evaluating a third radiation generated by the at least one optical component in response to being exposed to the second radiation, and
        locally exposing the photoresist layer to the first radiation and locally transforming the photoresist layer from the unmodified state to the modified state.

12. Method of claim 3 wherein
    the photoresist is polymerized in response to exposure to the first radiation, the polymerized photoresist being transparent for each of the following radiations:
        a second radiation that is capable of exciting the optical device to generate a third radiation, and
        the third radiation that is generated by the optical device while being excited by the second radiation.

13. Method of claim 3 wherein the at least one optical component is a single photon emitter.

14. Method of claim 3
    wherein the first radiation has a wavelength and/or pulse pattern that is capable of transforming the photoresist layer from an unmodified state to a modified state, and
    wherein the second radiation has a wavelength and/or pulse patter that is incapable of transforming the photoresist layer from the unmodified state to the modified state.

15. Method of claim 14 wherein
    said at least one optical component is adapted to generate a radiation of a third wavelength in response to being exposed to the radiation of the second wavelength and/or pulse pattern, said emitted radiation of the third wavelength being incapable of transforming the photoresist layer from the unmodified state to the modified state, and said step of observing the response of the at least one optical component includes detecting and/or evaluating the radiation of the third wavelength.

16. Method of fabricating an optical device, the method comprising the steps of:
depositing a photoresist layer on a carrier, said photoresist layer containing at least one optical component,
determining the position of the at least one optical component inside the photoresist layer before exposing the photoresist layer to a first radiation, said first radiation being capable of transforming the photoresist layer from an unmodified state to a modified state,
elaborating a device pattern based on the position of the at least one optical component, and
fabricating the elaborated device pattern by locally exposing the photoresist layer to the first radiation and locally transforming the photoresist layer from the unmodified state to the modified state,
wherein after determining the position of the at least one optical component inside the photoresist layer and before exposing the photoresist layer to said first radiation, the position of the at least one optical component is changed by applying a fourth radiation.

17. Method of claim 16 wherein the photoresist is polymerized in response to exposure to the first radiation, the polymerized photoresist being transparent for each of the following radiations:
a second radiation that is capable of exciting the optical device to generate a third radiation, and
the third radiation that is generated by the optical device while being excited by the second radiation.

* * * * *